United States Patent [19]
Peterson et al.

[11] Patent Number: 5,329,210
[45] Date of Patent: Jul. 12, 1994

[54] HIGH-SPEED DRIVER FOR AN LED COMMUNICATION SYSTEM OR THE LIKE

[75] Inventors: Lisa A. Peterson, Brecknock Township, Berks County; Stefan A. Siegel, Upper Macungie Township, Lehigh County, both of Pa.

[73] Assignee: AT&T Bell Laboratories, Murray Hill, N.J.

[21] Appl. No.: 791,828

[22] Filed: Nov. 13, 1991

[51] Int. Cl.[5] .......................................... H05B 41/16
[52] U.S. Cl. .................................. 315/246; 250/551; 250/552; 362/800
[58] Field of Search ................. 315/246; 250/552, 551; 362/800

[56] References Cited

U.S. PATENT DOCUMENTS

| | | | |
|---|---|---|---|
| 4,166,947 | 9/1979 | Dirksen | 250/199 |
| 4,295,226 | 10/1981 | Dombrowski | 455/618 |
| 4,723,312 | 2/1988 | Yamashita et al. | 455/613 |
| 4,730,114 | 3/1988 | Portmann | 250/551 |
| 5,103,084 | 4/1992 | Williams | 250/551 |
| 5,144,117 | 9/1992 | Hasegawa et al. | 362/800 |

OTHER PUBLICATIONS

Electronics Today International–(Aug. 1978), vol. 8, No. 8.
"Siecor Electro-Optic Products" Siecor Corporation, 1987 (200 MBaud Transmitter).

Primary Examiner—Robert J. Pascal
Assistant Examiner—Reginald A. Ratliff
Attorney, Agent, or Firm—Scott W. McLellan

[57] ABSTRACT

A high-speed driver for LED data communications systems. A differentiator provides a turn-on and a turn-off pulse of current to the LED. The amount of charge delivered during turn-off is adjusted to sweep substantially all of the carriers from the LED without reverse-biasing the LED.

11 Claims, 3 Drawing Sheets

HIGH-SPEED DRIVER FOR AN LED COMMUNICATION SYSTEM OR THE LIKE

BACKGROUND OF THE INVENTION

1. Field of the Invention

This invention relates to electro-optic communication systems in general and, more particularly, to circuits for driving light-emitting diodes or the like in those systems.

2. Description of the Prior Art

Light-emitting diode (LED) based data transmission system is a popular choice for low-cost data communication applications. However, LED based systems are not as high a speed as laser based systems. The primary reason for the disparity in speed between a laser and a LED based system is the relatively slow turn-on and turn-off time of the LED compared to a laser. The relatively slow turn-on and turn-off of the LED is substantially limited by the junction capacitance of the LED.

In U.S. Pat. No. 4,295,226, assigned to the same assignee as this invention, an LED driver is shown which shortens the turn-on and turn-off time of the LED. Because of the unidirectional nature of the LED, a small amount of current flows through the LED in the OFF state so that a negative current overdrive may be simulated. This speeds-up the turn-off of the LED. A consequence of this, however, is that the LED in the OFF state has sufficient current flowing therein to produce light. Hence, the contrast ratio between the ON and OFF states is less than the maximum possible and may be insufficient for certain applications.

SUMMARY OF THE INVENTION

A driver circuit for an LED or the like having an active region for producing light from recombinant carriers therein. The driver has a means for providing a ON current and an OFF current to the LED in response to an input. The driver is characterized by having a differentiator, responsive to the input, for providing a predetermined amount of charge in a turn-off pulse of current to the LED when the LED is to be turned off. The amount charge from the turn-off pulse of current is sufficient to sweep substantially all of the carriers from the LED active region.

The driver circuit, according to one embodiment of the invention, provides for the capability of rapidly switching the LED between ON and OFF states. The driver circuit is also capable of shortening the turn-off delay of the LED without driving the LED into reverse-bias.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
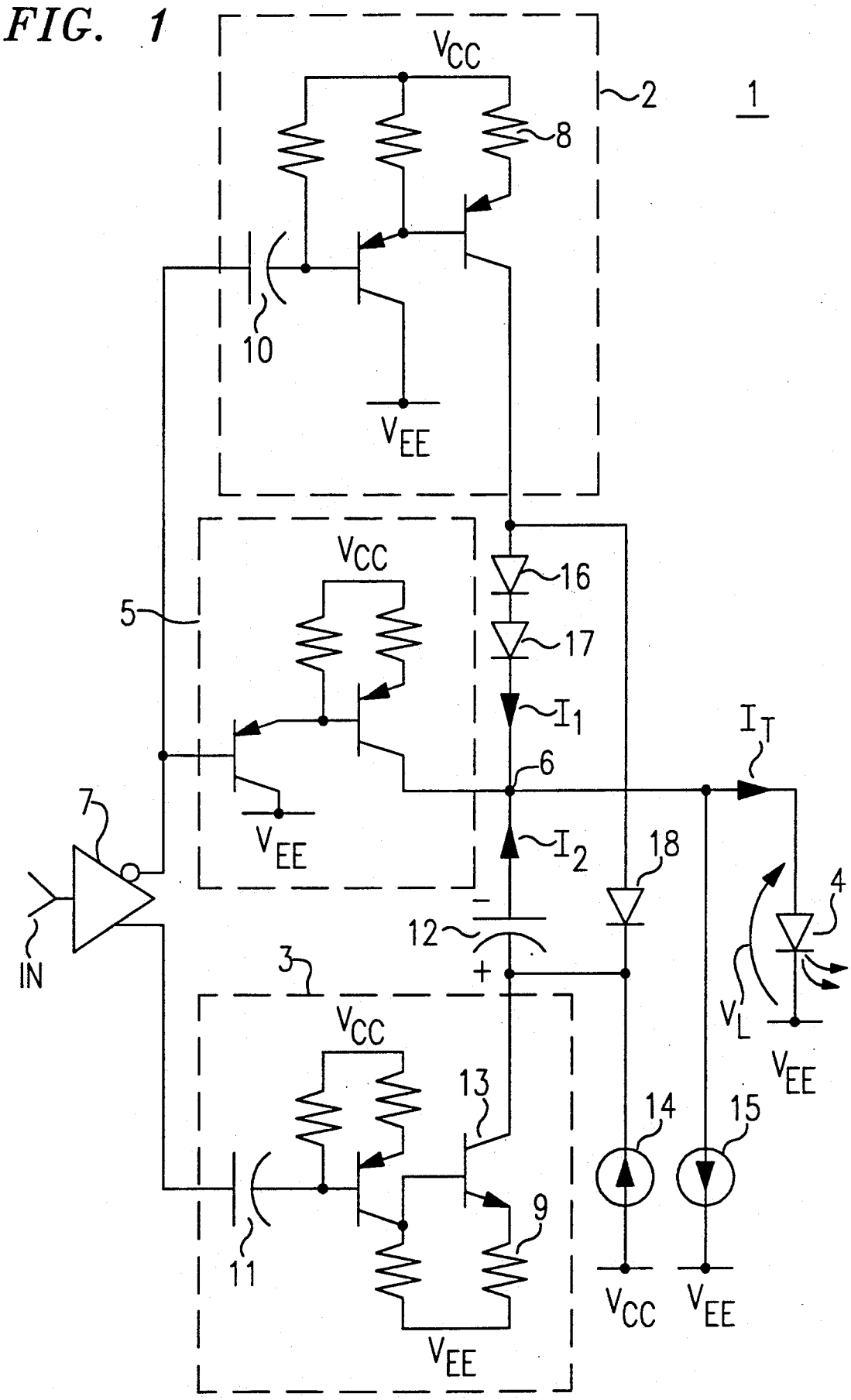
FIG. 1 is a simplified schematic diagram of one embodiment of the invention.

Referring to FIG. 1, a light-emitting diode (LED) driver 1 is shown having a differentiator 3, responsive to the input IN, for providing a turn-off pulse of current $I_2$ to LED 4. The value of capacitor 11, and the value of resistor 9, substantially determines the the amount of charge in the turn-off pulse of current sent to LED 4; the amount of charge is designed to be sufficient to sweep away substantially all of the carriers in the LED to quickly extinguish the LED 4.

As is well known, LEDs generate light when carriers recombine in the active area of the LED's junction. The carriers are generated by current flowing in the junction of the LED when forward biased. A consequence of forward biasing a semiconductor junction is the relatively high capacitance of the junction, typically about 200 pF for an LED used for high-speed optical data links or the like. To turn on or off the LED, the carriers, discussed above, must be correspondingly injected or extracted from the LED's junction. To do that quickly, the capacitance of the junction must be rapidly charged or discharged.

When discharging the LED's junction capacitance to quickly turn-off the LED, it is imperative that the LED not be reverse-biased. It has been found that the reverse-biasing of an LED, even for very short periods of time with a small voltage, degrades the LED and may shorten its lifetime. This reduces the reliability of the LED, an intolerable situation for most data communication systems. Thus, the driver circuit for the LED must avoid reverse-biasing the LED at all times.

The driver 1 shown in FIG. 1 provides for a pulse of current to hasten the turn-on and turn-off of the LED 4. A differentiator 2 generates a pulse of current ($I_1$) to turn-on the LED 4. Similarly, differentiator 3 generates a pulse of current ($I_2$) to turn-off the LED 4. A DC amplifier 5 provides the steady-state current, referred to here as the ON and OFF currents, for the LED 4. The currents from the differentiators 2, 3 and amplifier 5 are summed at node 6 to drive LED 4.

The operation of differentiators 2, 3 and amplifier 5 are conventional and a detailed description thereof is not necessary for a complete understanding of the invention. Briefly stated, differentiators 2, 3 each differentiate the input signal applied to the input IN using a conventional resistor-capacitor arrangement (not numbered). Differentiator 2 supplies a pulse of current to the LED 4 when the LED is to turn on. Differentiator 3 "takes" a pulse of current from the LED 4 when the LED is to be turned off, as will be explained below. Amplifier 5 produces a substantially constant current when the LED 4 is on (ON current) and substantially no current when the LED 4 is off (OFF current). While, for purposes here, the OFF current is substantially zero, a non-zero current may be used with the attendant loss of optical contrast between LED 4 being "on" and "off".

Figure 2A:
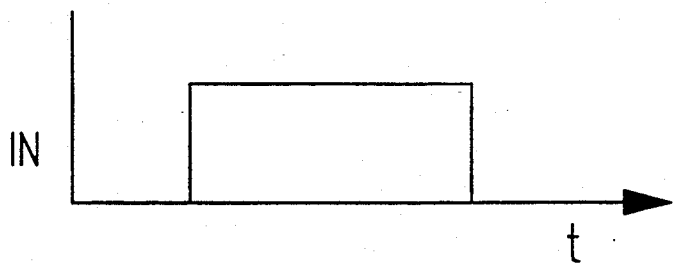
FIGS. 2A-2E are exemplary plots (not to scale) of the selected voltages and currents in the circuit shown in FIG. 1; and, FIG. 3 is a simplified schematic diagram of another embodiment of the invention.
Figure 2B:
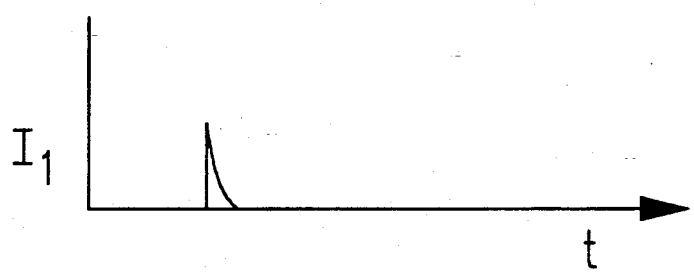
Figure 2C:
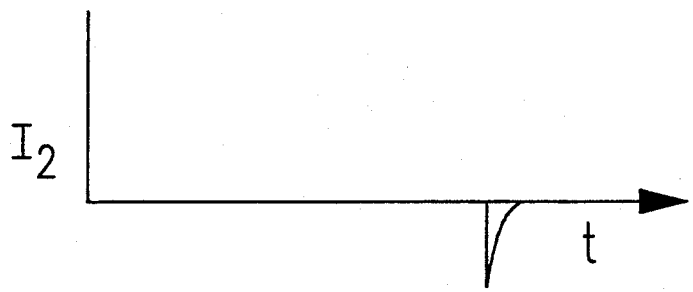

Describing the driver circuit 1 in more detail, an input signal applied to input IN is buffered by gate 7 to produce true and complement output signals. A rising edge input signal, shown in FIG. 2A, is inverted by buffer 7 and causes the differentiator 2 produce the turn-on current pulse shown in FIG. 2B. Similarly, when the input signal on input IN falls, the uninverted output of buffer 7 goes low, causing the differentiator 3 to produce a turn-off current pulse shown in FIG. 2C.

The peak of the turn-on and turn-off pulses of current are substantially determined by the resistances of resistors 8 and 9, respectively. The width of the turn-on and turn-off pulses of current are substantially determined by the capacitances of capacitors 10 and 11, respectively. Thus, the amount of charge delivered to LED 4 during turn-on of the LED 4 is substantially determined by the combined effects of resistor 8 and capacitor 10. Similarly, the amount of charge delivered to LED 4 during turn-off of the LED 4 is substantially determined by the combined effects of resistor 9 and capacitor 11.

The turn-off pulse of current (FIG. 2C) from differentiator 3 is negative largely due to capacitor 12 being charged to the indicated polarity by current sources 14, 15. Thus, when the output transistor 13 turns on, a negative pulse of current ($I_2$, FIG. 2C) is directed into LED 4. The energy for the pulse is substantially supplied by the charge stored in capacitor 12. Diodes 16, 17, and 18 provide a level shift for differentiator 2 and aid in the charging of capacitor 12 during the turn-on pulse of current ($I_1$, FIG. 2B). Further, the diodes 16, 17, and 18 help keep the transistors in the differentiators 2, 3 from saturating.

As stated above, current sources 14 and 15 provide a charging current to capacitor 12. Preferably, the current from source 15 is substantially the same as the current from source 14, i.e., current source 15 mirrors current source 14. Current source 14 may be a resistor coupled to $V_{CC}$.

Figure 2D:
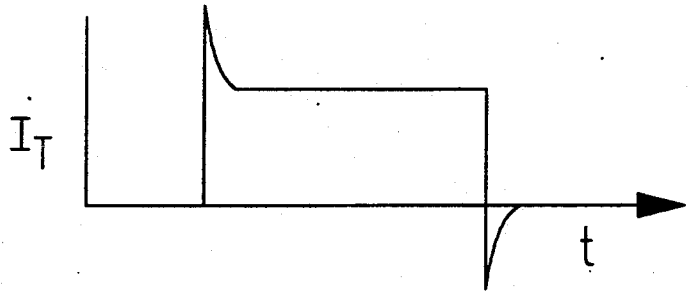

The currents $I_1$ (FIG. 2B), $I_2$ (FIG. 2C) and current from amplifier 5 are combined at node 6 to produce current $I_T$, shown in FIG. 2D. As shown, the current into the LED 4 ($I_T$) has a pulse of current at LED turn-on, a steady-state current while the LED 4 is ON, and a pulse of current at LED turn-off. Note that the polarity of the turn-off current pulse is negative, thereby rapidly sweeping carriers from the LED 4 and turning it off. The amount of charge in the turn-off pulse of current is adjusted to keep the LED 4 from being reverse-biased.

Figure 2E:
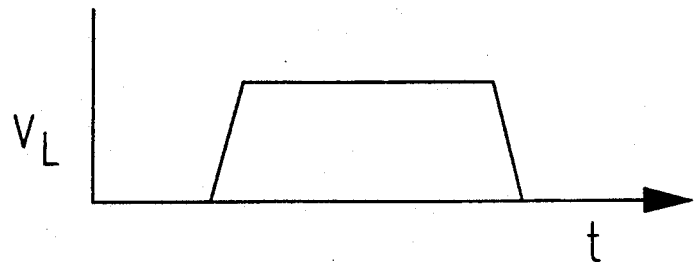

As discussed above, the amount of charge in the turn-off pulse of current is adjusted by varying the capacitance of capacitor 11 and the resistance of resistor 9. To assure that substantially all of the carriers are swept from the active area of the LED 4 at turn-off, the amount of charge in the turn-off pulse of current is adjusted so that the voltage across the LED 4 is substantially zero at the end of the pulse, as shown in FIG. 2E. Preferably, the voltage across the LED 4 is just slightly positive (not shown) after the pulse to assure that, with processing and temperature variations of the driver 1 and LED 4, that the voltage across the LED never goes negative.

Figure 3:
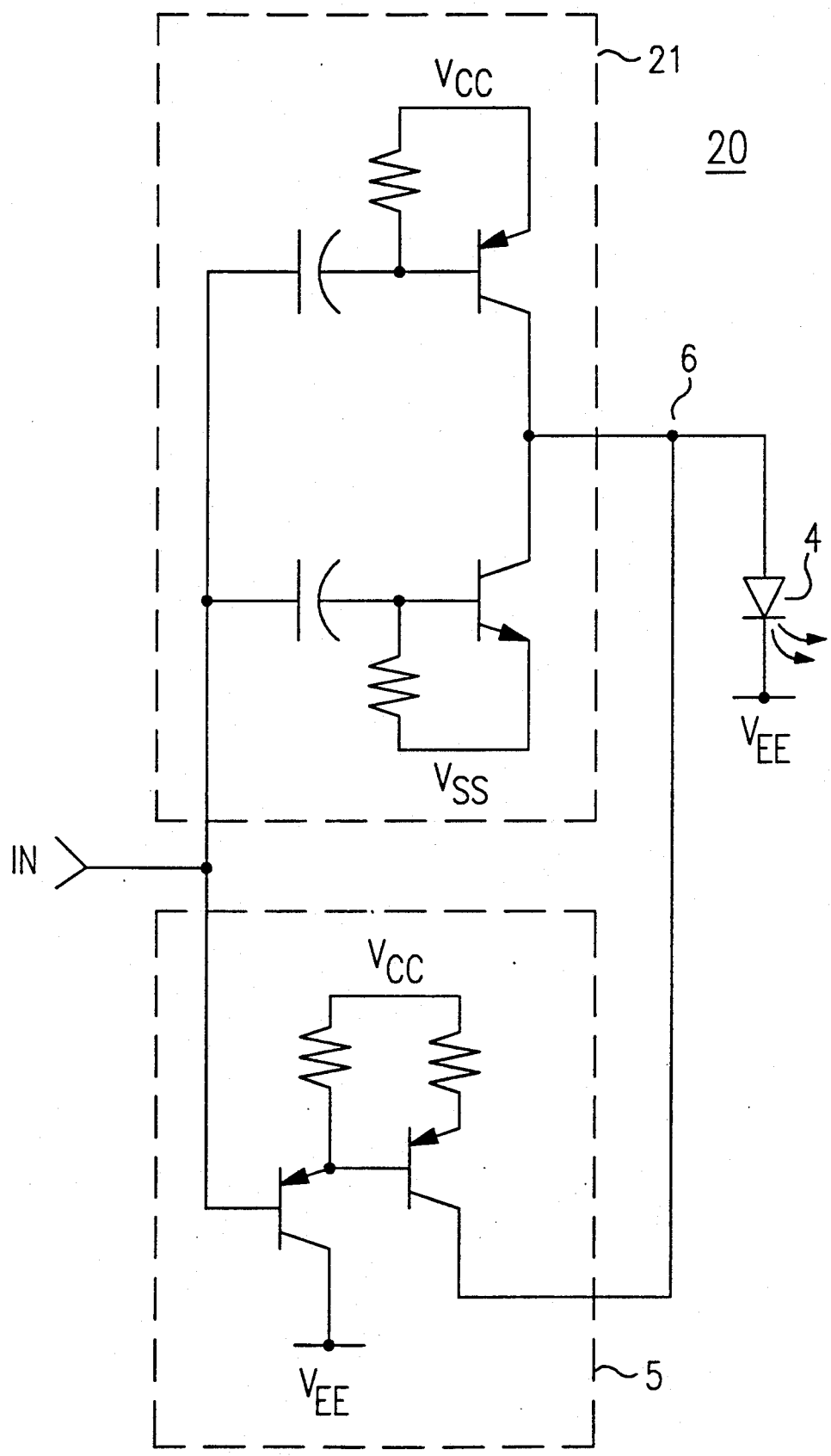

Another embodiment of an LED driver 20 using a single differentiator is shown in FIG. 3. Here, a single differentiator 21 provides both the turn-on and the turn-off pulse of current to the LED 4. To produce a negative-going current pulse in this embodiment, the differentiator 21 has a supply voltage of $V_{SS}$ which is approximately equal to, or more negative than, the $V_{EE}$ supply voltage ($V_{CC}$ is more positive than $V_{EE}$). The amount of charge in the turn-on and the turn-off pulses is substantially determined by the time-constant of the differentiator 21 (as set by the conventional arrangement of the capacitors, resistors, and transistors therein) and the voltages of the respective power supply voltages. Amplifier 5 is similar to that used in the driver 1 of FIG. 1. Also as described above, the current from amplifier 5 is combined at node 6 with the turn-on and turn-off pulses of current from differentiator 21. Thus, the current from node 6 to the LED 4 ($I_T$) and the voltage across the LED 4 ($V_L$) is substantially the same as that shown in FIGS. 2D and 2E, respectively.

EXPERIMENTAL RESULTS

The following supply voltages and approximate component values were used to analyze the performance of the driver 1 of FIG. 1 at 250 Mbit/second:

| | |
|---|---|
| currents 14, 15 | 6 mA, maximum |
| capacitors 10, 11 | 10 pF |
| capacitor 12 | 50 pF |
| resistors 8, 9 | 10 ohms |
| $V_{CC}$ | 5 volts |
| $V_{EE}$ | 0 volts |

Using the above values in the driver 1 of FIG. 1, the resulting current into the LED 4 ($I_T$), as shown in FIG. 2E, is:

| | |
|---|---|
| ON current | about 80 mA |
| turn-on peak current | about 120 mA |
| turn-off peak current | about $-40$ mA |

No reverse bias of the LED 4 has been observed.

It is understood that opposite polarity devices may be substituted for the ones shown (i.e., NPN transistors for PNP, etc.) with the attendant changes to the diode and power supply voltage polarities.

Having described two embodiments of this invention, it will now be apparent to one of skill in the art that other embodiments incorporating its concept may be used. Therefore, this invention should not be limited to the disclosed embodiments, but rather should be limited only by the spirit and scope of the appended claims.

We claim:

1. A driver for an LED or the like having an active region for producing light from recombinant carriers therein, the driver having a means for providing a ON current of a first polarity and an OFF current to the LED in response to an input, pulse characterized by:
    a differentiator, responsive to the input pulse for providing a predetermined amount of charge in a turn-off pulse of current to the LED when the LED is to be turned off, the turn-off pulse of current having a polarity opposite the first polarity;
    wherein the amount charge is sufficient to sweep substantially all of the carriers from the LED active region.

2. The driver as recited in claim 1, wherein the amount of charge in the turn-off pulse of current is limited such that the LED remains forward biased.

3. The driver as recited in claim 2, wherein the differentiator also provides a turn-on pulse of current to the LED when the LED is to be turned on.

4. The driver as recited in claim 2, further characterized by:
    another differentiator, responsive to the input, for providing a turn-on pulse of current to the LED when the LED is to be turned on.

5. The driver as recited in claims 3 or 4, further characterized by:
    a current summing means for summing the turn-on, turn-off, ON and OFF currents prior to the application of the currents to the LED.

6. The driver as recited in claim 5, wherein the OFF current is substantially zero.

7. The driver as recited in claim 5, wherein the turn-off pulse of current has a value opposite the ON current value.

8. A driver for an LED or the like having an active region for producing light from recombinant carriers therein, the driver having a means for providing a ON current of a first polarity and a substantially zero OFF current to the LED in response to an input pulse, characterized by:
   a first differentiator, responsive to the input pulse, for providing a predetermined amount of charge in a turn-off pulse of current to the LED when the LED is to be turned off, the turn-off pulse of current having a polarity opposite the first polarity; wherein the amount of charge is limited such that the LED remains forward biased.

9. The driver as recited in claim 8, further characterized by:
   second differentiator, responsive to the input, for providing a turn-on pulse of current to the LED when the LED is to be turned on.

10. The driver as recited in claims 9, further characterized by:
    a current summing means for summing the turn-on, turn-off, ON and OFF currents prior to the application of the currents to the LED.

11. The driver as recited in claim 10, wherein the turn-off pulse of current has a value opposite the ON current value.

* * * * *